United States Patent [19]
Montijo

[11] Patent Number: 5,959,607
[45] Date of Patent: Sep. 28, 1999

[54] TRACE COLORING SYSTEM AND METHOD FOR A SIGNAL MEASUREMENT DEVICE HAVING A COLOR DISPLAY

[75] Inventor: Allen Montijo, Colorado Springs, Colo.

[73] Assignee: Hewlett-Packard Company, Palo Alto, Calif.

[21] Appl. No.: 08/733,290

[22] Filed: Oct. 17, 1996

[51] Int. Cl.⁶ ................................................ G09G 5/36
[52] U.S. Cl. ........................ 345/134; 348/185; 368/117; 324/76.19
[58] Field of Search .................................. 345/134, 150, 345/440; 348/185, 186; 368/117, 118; 324/121, 76.19

[56] References Cited

U.S. PATENT DOCUMENTS

| | | | |
|---|---|---|---|
| 4,771,275 | 9/1988 | Sanders | 345/186 |
| 5,065,147 | 11/1991 | Rice et al. | 345/134 |
| 5,283,596 | 2/1994 | Long | 345/134 |
| 5,434,593 | 7/1995 | Lecklider et al. | 345/134 |
| 5,530,454 | 6/1996 | Etheridge et al. | 345/134 |
| 5,739,807 | 4/1998 | Thong | 345/134 |

*Primary Examiner*—Bipin H. Shalwala
*Assistant Examiner*—Ricardo Osorio

[57] ABSTRACT

A trace coloring system enhances signal information that is provided to a user of a signal measurement device, for example, a digitizing oscilloscope or spectrum analyzer, having a color display for displaying graphical depictions of electrical signals. Trace coloring logic (hardware, software, or a combination thereof) colors a trace with different colors, each indicating a corresponding range of signal values. As an example, in the context of an oscilloscope, the trace may be colored with various colors to visually indicate which areas of the trace correspond to particular logic levels. A first color may be allocated to a logic low ("0"), a second color to a logic high ("1"), a third color to an indeterminate range that is between logic low and high, and a fourth color to an extreme value that is outside a desired or acceptable predefined logic range. In the preferred embodiment, the trace coloring logic is implemented in software that is executed by a processor. A frame buffer is interfaced with the processor. The frame buffer stores display data including a word for each pixel. Optionally, prepainting logic may be employed in the trace coloring logic. The prepainting logic assigns color values to pixels of the trace based upon locations of the pixels within the display map. When prepainting is employed, the frame buffer is preferably video random access memory (VRAM) configured to permit modification of bits of each word, while masking other bits of each word, so that updating of each word can be accomplished in a single access operation to the memory.

27 Claims, 4 Drawing Sheets

TRACE COLORING SYSTEM AND METHOD FOR A SIGNAL MEASUREMENT DEVICE HAVING A COLOR DISPLAY

FIELD OF INVENTION

The present invention generally relates to oscilloscopes, and more particularly, to a trace coloring system and method for enhancing signal information that is provided to a user of a signal measurement device (e.g., an oscilloscope, spectrum analyzer, etc.) with a color display for displaying electrical signals. Although not limited to this particular application, the trace coloring system and method are particularly suited for implementation in an digitizing oscilloscope.

BACKGROUND OF THE INVENTION

An oscilloscope is a type of signal measurement device that is utilized to qualitatively and quantitatively analyze waveforms, typically in the time domain, of electrical signals. It generally provides much more information than a logic analyzer, which merely indicates whether a signal is a logic high ("1") or a logic low ("0"). The oscilloscope displays an analog graphical representation, or trace, of one or more input channels. The display screen has graticule lines defining a graph that are used for quantitatively analyzing the trace. Many oscilloscopes are designed to produce these graphs with 8 graticule divisions situated vertically and 10 graticule divisions situated horizontally. In one typical mode of operation, the vertical axis (y in an x-y coordinate system) of the display screen graph represents voltage amplitude, whereas the horizontal axis represents time. In another typical mode of operation, the vertical and horizontal axes each represent an input channel so that two input channels can be visually compared.

When viewing oscilloscope traces of logic signals, it is desirable to know which of "n" different voltage regions the signal is in at any point in time. For example, if the setup time of a electrical flip-flop latch is 5 nanoseconds (ns) and the hold time is 2 ns, it is desirable to know whether or not the data input signal is a valid logic level during the entire 7 ns of setup and hold time with respect to the input clock signal. As another example, it is also often desirable to know if overshoot or undershoot exceeds some specified voltage threshold. With a conventional oscilloscope trace, this determination can be time consuming and contributes to user fatigue.

One known solution involves marking the screen with one or more horizonal lines at the vertical positions of interest. For example, one could adjust the gain and/or offset of the oscilloscope input channel to place the waveform so that the graticule lines of the display serve as horizontal reference lines. This solution is only acceptable if gain and/or offset adjustments are calibrated, or if some form of a calibration signal exists so that the user may make these adjustments.

Another known solution involves using y-markers, which many oscilloscopes provide, to determine the logic level within an area of interest. Unfortunately, there are usually only two vertical voltage markers available, thereby limiting the number of distinct voltage readings and the number of waveforms that can be evaluated at one time. Additionally, both of the foregoing solutions suffer from a lack of instantaneous recognition, which contributes to operator fatigue.

Still another solution is to display a trace with only distinct levels in a vertical arrangement. A logic analyzer is an extreme example of a device that employs this methodology. In a logic analyzer, a given trace can only be plotted in one of two different vertical positions, signifying whether the signal is above or below a specified threshold. Another example is a model TLS216 oscilloscope that is manufactured by and commercially available from Tektronix, Inc., U.S.A. In this oscilloscope, a trace is plotted at three distinct vertical levels to signify valid high, valid low, or intermediate. Although the devices of the latter two examples give instantaneous recognition, they both suffer from one major drawback: they eliminate a large amount f interesting and useful qualitative data, which is the major reason why someone uses an oscilloscope instead of a logic analyzer in the first place.

Thus, a heretofore unaddressed need exists in the industry for an improved system and method for visually indicating on an oscilloscope display the correspondence between areas of interest on a trace and different logic levels.

SUMMARY OF THE INVENTION

The invention provides for a trace coloring system and method for enhancing signal information that is provided to a user of a signal measurement device (e.g., an oscilloscope, spectrum analyzer, etc.) with a color display for displaying electrical signals. The trace coloring system can be implemented in hardware, software, or a combination thereof, and is configured to color a trace, or a graphical display representation of an electrical signal, with a plurality of different colors, each indicating a corresponding range of signal values. Stated in other words, "n" different areas of interest are produced on screen in "n" different colors to visually show correspondence between the areas of interest and the ranges of signal values. The ranges may correspond to, for instance, voltage, current, phase, time, frequency, and/or time.

As an example, in the context of an oscilloscope, the trace may be colored with various colors to visually indicate which areas of the trace correspond to particular logic levels. A first color may be allocated to a logic low ("0"), a second color to a logic high ("1"), a third color to an indeterminate range that is between logic low and high, and a fourth color to an undesirable extreme value that is outside a desired or acceptable predefined logic range.

As another example, the trace may also be colored with a particular color to indicate a phase of a signal being less than or higher than a predetermined threshold or reference signal.

In the preferred embodiment, although not necessary to practice the invention, the trace coloring system is implemented in a digitizing oscilloscope, and more particularly, in software that is executed by a processor, such as a microprocessor, within the oscilloscope. Hence, the trace coloring system can be stored on, transported, and read from any computer readable medium. A frame buffer is interfaced with the processor. The frame buffer stores display data, or a display map, including a word defining each pixel.

Optionally, prepainting logic may be employed in association with the trace coloring system. The prepainting logic preassigns color values to pixels of the trace based upon locations of the pixels within the display map. In other words, the prepainting logic defines color bands in the display map. When prepainting is employed, the frame buffer is preferably video random access memory (VRAM) that is configured to permit modification of selected bits of each word, while masking other nonselected bits of each word, so that updating of each word can be accomplished in a single access operation to the VRAM.

The invention can also be conceptualized as providing a method for enhancing signal information that is provided to a user of a signal measurement device with a color display for displaying electrical signals by visually separating regions of interest. In this regard, the method comprises the following steps: receiving an analog input signal; producing a trace from the analog input signal; and displaying the trace with a plurality of different colors, each indicating a corresponding range of signal values.

The invention has numerous advantages, a few of which are delineated hereafter, as merely examples.

An advantage of the invention is that it gives instant recognition for "n" different regions of interest in a trace, yet preserves all of the qualitative information that is captured by the signal measurement device.

Another advantage of the invention is that it can be utilized along with other powerful display techniques, such as gray-scale variable persistence, infinite persistence, and (with a slight modification) color graded histograms, all of which are known in the art.

Another advantage of the invention is that it can be used to enhance other types of data plots in respects aside from boolean logic levels (1's and 0's). The designer of an analog circuit might be interested in whether a signal is positive, negative, or has exceeded some value. Furthermore, the invention may be used to enhance plots where the areas of interest are in the x dimension or in both dimensions, or have arbitrary shapes in the x-y domain. For instance, in the context of analyzing setup and hold time of a data (d-type) latch, it may be desirable to have an x-colored dependence to instantly indicate what data is actually within the setup and hold time.

Another advantage of the invention is that it can be used to enhance other types of data plots where the areas of interest involve phase relationships. For example, consider a trace generated from a fast Fourier transform (FFT) function. An FFT magnitude plot could be enhanced by showing the FFT phase relative to a reference or threshold via a particular color.

Another advantage of the invention is that it can be practiced in virtually any type of signal measurement device that has a color display for providing graphical depictions of electrical signals.

Another advantage of the invention is that the prepainting methodology may be employed to simplify logic complexity and implementation. When this novel methodology is implemented, a processor or other dedicated system can plot the waveform without testing to see what color should be plotted. Once the screen has been prepainted, any number of waveforms can be plotted without additional overhead.

Another advantage of the invention is that the prepainting methodology can be used in connection with commercially available video random access memory (VRAM) in order to provide a high performance implementation.

Another advantage of the invention is that it can be employed along with the concept of allocating a different color to different channel inputs.

Another advantage of the invention is that it is simple in design, reliable in operation, and easily implemented in mass production of oscilloscopes.

Other objects, features, and advantages of the present invention will become apparent to one with skill in the art upon examination of the following drawings and detailed description. It is intended that all such additional objects, features, and advantages be included herein within the scope of the present invention, as defined in the appended claims.

BRIEF DESCRIPTION OF THE DRAWINGS

The present invention can be better understood with reference to the following drawings. The drawings are not necessarily to scale, emphasis instead being placed upon clearly illustrating principles of the present invention. Furthermore, like reference numerals designate corresponding parts throughout the several views.

DETAILED DESCRIPTION OF THE PREFERRED EMBODIMENT

The trace coloring system and method of the invention can be implemented in any suitable signal measurement device that has a color display for illustrating a graphical image of an electrical signal. An example of such a signal measurement device is a digitizing oscilloscope. The invention will be described in detail hereafter in the context of a digitizing oscilloscope. However, it should be understood that the principles of the invention can be applied to many other types of signal measurement devices.

Figure 1:
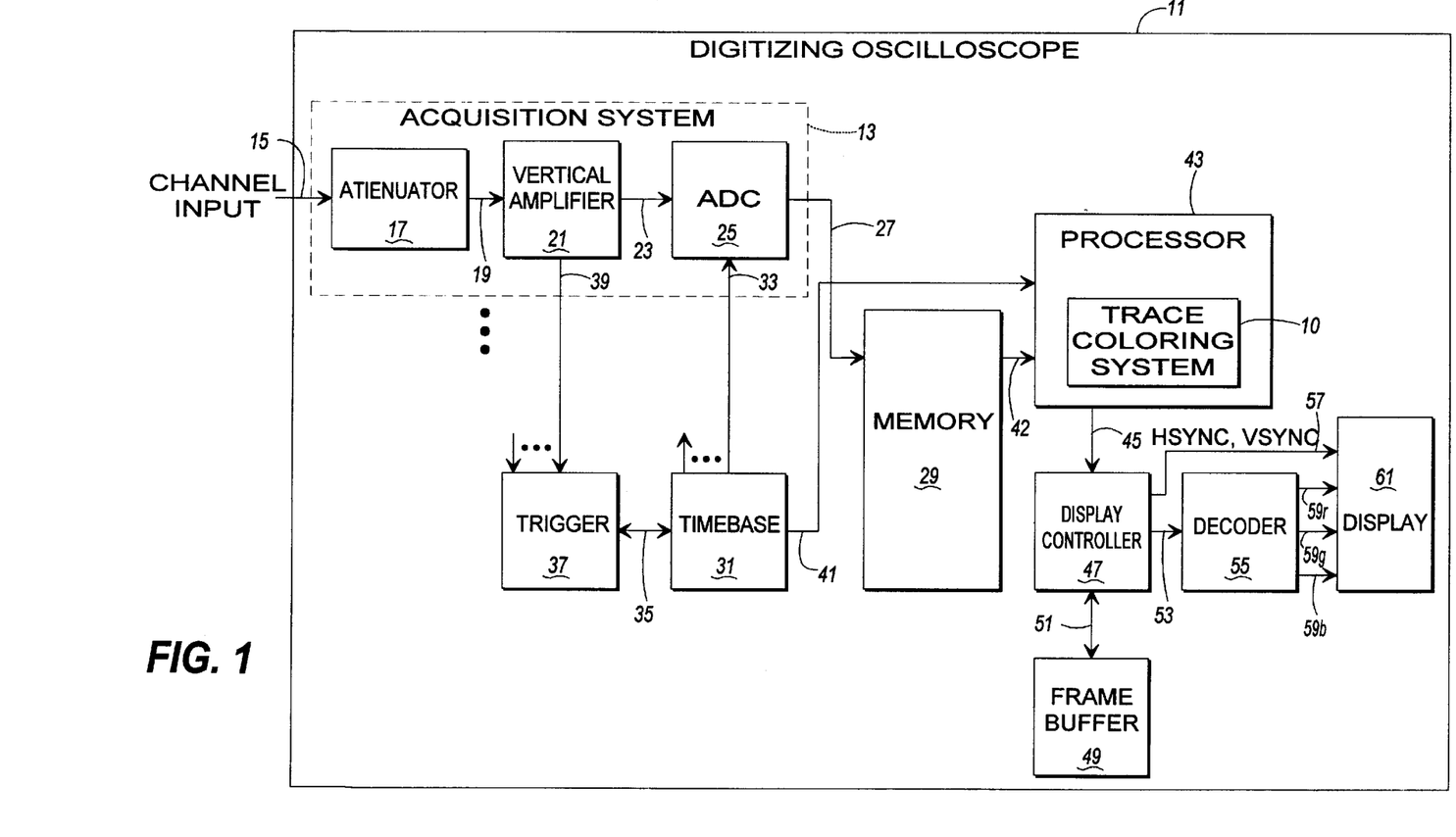
FIG. 1 is an electronic block diagram of a possible implementation of a digitizing oscilloscope, which is an example of a signal measurement device and which employs the trace coloring system and method of the invention.

An example of a possible implementation of a digitizing oscilloscope is shown in FIG. 1 and is generally denoted by reference numeral 11. Generally, in accordance with the trace coloring system and method of the invention, an analog oscilloscope trace is colorized, or color coded, so that different regions of interest exhibit different colors. In a preferred embodiment, regions of the trace residing at different logic levels are accorded different colors. However, the colors can be utilized to highlight other features of a trace, including for example, the phase of a particular trace region relative to a predefined threshold or reference.

I. Digitizing Oscilloscope

A. Architecture

A digitizing oscilloscope 11 has one or more channel inputs 15, but typically has at least two and oftentimes four channel inputs 15. The digitizing oscilloscope 11 includes one or more acquisition systems 13, one for each channel input 15 (electrical signal to be plotted). Each acquisition system 13 receives, processes, digitizes, and stores digital data corresponding with a respective channel input 15.

Each acquisition system 13 typically includes, among other things, an attenuator 17, a vertical amplifier 21, and an analog-to-digital converter (ADC) 25. The attenuator 17 is configured to controllably attenuate the corresponding channel input 15. The attenuator 17 is usually constructed with a series or network of resistors and/or switches. The attenuator 17 essentially allows voltage amplitude scaling of the channel input 5, setting of the input coupling, and setting of the input impedance of the oscilloscope 11.

The vertical amplifier 21 receives an attenuated signal 19 from the attenuator 17 and provides additional scaling of the channel input 15. The vertical amplifier 21 can provide a fixed or variable gain, while maintaining fidelity. The vertical amplifier 21 feeds an amplified signal 23 to the ADC 25.

The ADC 25 can be any suitable design, many of which are well known in the art. The ADC 25 is configured to convert the analog input 23 to a digital signal 27, or a series of digital code words, which is communicated to a memory 29. Typically, the ADC 25 has two primary components: (a) a sample and hold circuit and (b) a flash converter. Both of these components are well known and understood in the art. The sample and hold circuit samples the input signal 23 at the sampling rate of the oscilloscope 11 and holds the sample value constant for the flash converter. The flash converter takes each sample value and converts each into a digital value at a particular sample point in time. The oscilloscope 11 stores sample points in the memory 29 for additional processing, as is further described hereinafter.

A timebase 31, which can be implemented with any suitable circuitry, is configured to control the timing of the acquisition system(s) 13 by directly controlling the ADC 25 and a trigger mechanism 37 in each acquisition system 13. In general, the timebase 31 sets and controls the central timing of the oscilloscope 11. Moreover, the user of the oscilloscope provides timing inputs (time/div) to the timebase 31, which ultimately affect the scaling and appearance of the corresponding signal input on the display 61.

The trigger mechanism 37 is designed to analyze the signal input and to find trigger events in the signal inputs, while the timebase 31 provides the central timing of the oscilloscope 11. The trigger mechanism 37 searches an input signal, as indicated by reference arrow 39, for the set of trigger conditions that define the trigger event. A valid trigger is typically a rising edge of a selected channel input 15. When the trigger mechanism 37 finds a trigger event, it informs the timebase 31 that a trigger event has occurred. The timebase 31 then calculates the amount of time from the trigger event to the next acquired sample point. The oscilloscope 11 uses this value to determine the horizontal position of all of the acquired sample points on the display 61. The timebase 31 passes the foregoing time information to a processor 43, as indicated by reference arrow 41.

The processor 43, preferably a microprocessor, is configured to read the sample points (digital values) from the memory 29, to receive timing information 41 from the timebase 31, to perform processing steps, for example, interpolation and color coding, and to perform plotting of the sample points on the display. The timing information enables the processor 43 to apply the appropriate time (x in x-y coordinate system of FIG. 2) values to the sample points.

In the preferred embodiment, the trace coloring system 10 of the invention is implemented in software that is executed by the processor 43. The architecture of the software will be described later in this document with reference to FIG. 3. Generally, pursuant to the trace coloring system 10, the processor 43 can select a color for each picture element (pixel) as the processor 43 plots each pixel into the frame buffer 49. This method places minimal additional restrictions on the format in which the data is stored in the frame buffer 49. Alternatively, a prepainting methodology may be employed, in which case the processor 43 need not make any decisions regarding color of a trace. The prepainting methodology will be described in further detail later in this document.

It should be emphasized that the trace coloring system 10 can be implemented in software, hardware, or a combination thereof. When implemented in software, as in the case of the preferred embodiment, the trace coloring system 10 can be stored on any computer-readable medium for use by or in connection with a computer-related system or method. In the context of this document, a computer-readable medium is an electronic, magnetic, optical, or other physical device or means that can contain or store a computer program for use by or in connection with a computer-related system or method.

The frame buffer 49 is any suitable memory device. The frame buffer 49 reads and writes pixel data. Each pixel is defined by any suitable number of data bits. In the preferred embodiment, each pixel is defined by 16 bits, 4 of which contain display information for items other than waveforms (e.g., graticule or markers). The remaining 12 bits are utilized to draw waveforms and define their colors. Any number of the remaining 12 bits can be utilized to define color, for example, two or three. In one embodiment of the invention, 2 bits are reserved for color prepainting and the remaining 10 bits are available for waveform information and other mode information, for example, 3 waveform planes of 3 intensity bits each. Moreover, it should be noted that each waveform plane may have a unique color (e.g., yellow for channel input 1, green for input channel 2, etc.) associated with it.

A display controller 47 is provided to control the display 61 and frame buffer 49. The display controller 47 is connected to the processor 43, as indicated by reference arrow 45, for receiving plotted data points from the processor 43. The display controller 47 forwards the plotted data points to a frame buffer 49, as indicated by reference arrow 51. The frame buffer 49 can be any suitable memory storage device.

The display controller 47 essentially performs the functions necessary to operate the display 61. It generates timing signals for the display 61, such as horizontal synchronization (hsync) and vertical synchronization (vsync) signals 57, reads pixel data 51 from the frame buffer 49, and sends the pixel data 53 to a decoder 55, which is ultimately passed in a decoded format $59r$, $59g$, $59b$ (red, green, blue, respectively) to the display 61.

The decoder 55 is preferably a logic network that is programmable. It generally divides the pixel data 53 into three digital color signals $59r$, $59g$, $59b$.

The display 61 is connected to the decoder 55 and receives the color signals $59r$, $59g$, $59b$ therefrom. The display 61 can be any suitable display device, for example, a picture tube display device (e.g., a cathode ray tube (CRT)) or liquid crystal (LCD) display device. In the case of a picture tube display device, the display 61 has a digital-to-analog converter (DAC; not shown for simplicity) for each of the inputs $59r$, $59g$, $59b$. The DACs change the digital codes to continuous voltages to illuminate the pixels on the display 61. For LCD displays 61, the DACs are not needed.

B. Operation

Initially, the user inputs desired timing and trace position parameters. The timing parameter is a specification of the amount of time for each division on the display screen, and the position parameter, or time (horizontal) offset, corresponding to the traces.

Under the control of the processor 43, the acquisition system 13 begins to acquire data for display. The timebase 31 is forwarded the timing and offset parameters and is advised to commence operation. The timebase 31 controls the ADC 25 and the memory 29 to commence successive acquisition operations, each of which results in a data as well as screen update. During each acquisition operation, the following sequence of events occurs.

The timebase 31 does not immediately advise the trigger 37 to analyze the incoming signal 31 for a trigger event in order to insure acquisition of data for display of the signal prior to the trigger event (the signal waveform during negative time). Thus, at a time later, the timebase 31 advises the trigger 37 to analyze the incoming signal for a trigger event, such as a rising edge of a selected channel input 15.

When the trigger mechanism 37 finds a trigger event, it informs the timebase 31 that a trigger event has occurred. The timebase 31 waits for a period of time in order to acquire as much information after the trigger event as the user has selected, at which point the timebase 31 stops the acquisition by halting the ADC 25 and the memory 29. The timebase 31 then calculates the amount of time from the trigger event to the next acquired sample point and forwards it to the processor 43, as indicated by reference arrow 41. The processor 43 of the oscilloscope 11 uses this value to determine the horizontal position of all of the acquired sample points on the display 61.

The processor 43 reads the digital data from the memory 29, processes it, and drives pixel data to the frame buffer 49. While processing the digital data, the trace coloring system 10 that is executed by the processor 43 combines color data with each pixel value. The display controller 47 ultimately reads the pixel data from the frame buffer 49 and drives the data to the display 61.

In order to better understand attribution of the color data to pixel values by the trace coloring system 10, a specific example is warranted.

EXAMPLE

For illustrative purposes, assume that a user of the oscilloscope 11 is probing a transistor-transistor logic (TTL) signal. The TTL standard specifies that a valid logic low input signal is less than or equal to 0.8 volts and a valid logic high is greater than or equal to 2.0 volts. If the signal is between these two values, then the signal is indeterminate. Because this is a high speed type of logic, the user might also be interested in inductance or transmission line effects that give rise to undesirable extreme voltages of less than 0.0 volts or of greater than 5.0 volts during switching transients. In accordance with the trace coloring system 10 of FIG. 1, the channel input 15 is plotted in different colors to differentiate between the regions of interest, i.e., the different logic levels, as indicated in Table A below.

TABLE A

| Color | Input Voltage |
| --- | --- |
| red | $V_{in} < 0.0$ v |
| blue | $0.0$ v $\leq V_{in} \leq 0.8$ v |
| yellow | $0.8$ v $< V_{in} < 2.0$ v |
| green | $2.0$ v $\leq V_{in} \leq 5.0$ v |
| red | $5.0$ v $< V_{in}$ |

Figure 2:
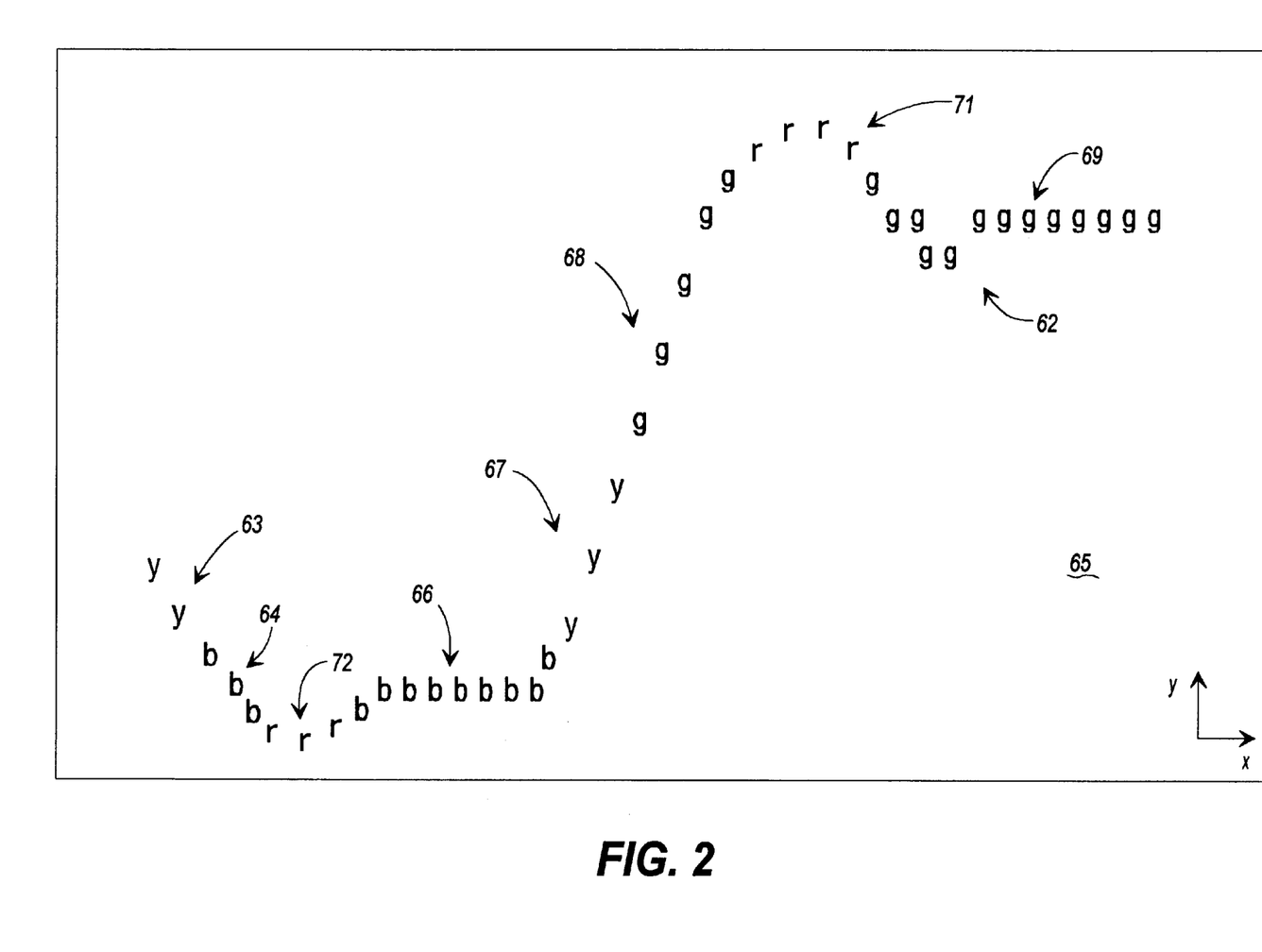
FIG. 2 is a graphical representation of an example of a colorized trace that can be generated by the digitizing oscilloscope of FIG. 1.

FIG. 2 shows an example, intended to be nonlimiting, of a trace 62 that may be generated on the screen 65 of the display 61 (FIG. 1), utilizing the scheme set forth in Table A. The trace 62 has the following trace regions: a trace region 64, 66 that exhibit a blue color, indicating a logic low (i.e., $0.0$ v$\leq V_{in} \leq 0.8$ v); trace regions 63, 67 that exhibit a yellow color, indicating an indeterminate logic level (i.e., $0.8$ v$<V_{in}<2.0$ v); trace regions 68, 69 that exhibit a green color, indicating a logic high (i.e., $2.0$ v$\leq V_{in} \leq 5.0$ v); and trace regions 71, 72 that exhibit a red color, indicating undesirable high and low extreme voltages (i.e., $5.0$ v$<V_{in}$ and $V_{in}<0.0$ v, respectively). Accordingly, it is easy to visually differentiate between the regions of interest in the trace 62 and identify the relationship between these regions and logic levels.

Figure 3:
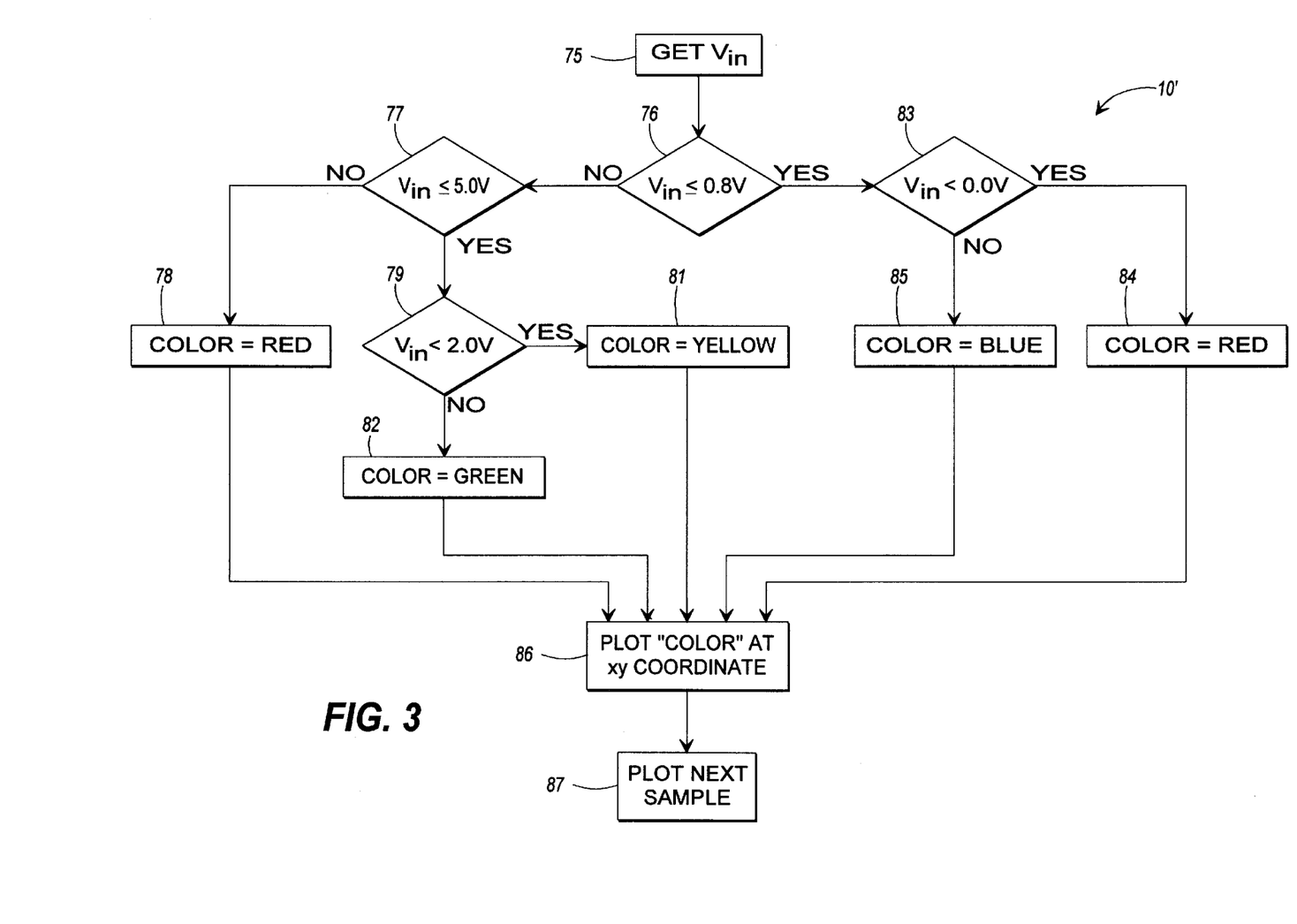
FIG. 3 is a flow chart showing the logic that is implemented by the trace coloring system within the digitizing oscilloscope of FIG. 1 in order to generate the graphical representation of FIG. 2.

FIG. 3 shows a flow chart 10' for the trace coloring system 10, implemented as software code, for implementing the functionality of this example. In general, flow chart 10' sets out the high level architecture and functionality of the code for implementing the trace coloring system 10 in the processor 43. The code drives the processor 43 (FIG. 1) to decide what color to plot the individual pixels.

Referring to FIG. 3, the trace coloring system 10' obtains an input voltage $V_{in}$, which corresponds to an already identified x coordinate of a pixel on the display screen 65 (FIG. 2). Next, as indicated by block 76, a determination is made as to whether the input voltage $V_{in}$ is less than or equal to 0.8 v. If not, then block 76 transfers to block 77.

Block 77 makes a determination as to whether the input voltage $V_{in}$ is extreme by determining whether it is less than or equal to 5.0 volts. If it is greater than 5.0 volts, then the voltage is extreme, and block 77 transfers to block 78, which sets the color to red. If the input voltage $V_{in}$ is less than 5.0 volts, then the voltage is not extreme, and the color will be set to either yellow or green, depending upon whether the voltage is indeterminate or a logic high, respectively. In this regard, block 77 transfers to block 79.

Block 79 makes a determination as to whether the input voltage $V_{in}$ is less than 2.0 v. If so, then block 79 transfers to block 81, which sets the color to yellow. If not, then block 79 transfers to block 82, which sets the color to green.

If, at block 76, it is determined that the input voltage $V_{in}$ is less than 0.8 v and is therefore either a logic low or a low extreme voltage, then block 76 transfers to block 83. Block 83 makes an inquiry as to whether the input voltage $V_{in}$ is less than 0.0 v in order to determine whether the voltage represents a low extreme value. If so, then block 83 transfers to block 84, which sets the color to red. If not, then block 83 transfers to block 85, which sets the color to blue. After the color is set by one of blocks 78, 81, 82, 84, 85, then the color is plotted at the particular x-y coordinates, as indicated at block 86. Block 86 then transfers to block 87, which retrieves the next sample.

II. Prepainting Methodology

As an optional feature, in order to minimize the complexity of logic for assigning colors to pixels, it is possible to base the coloring methodology of the trace coloring system 10 on the x-y coordinates of screen 65 (or the display map corresponding thereto) of FIG. 2. In this regard, if a pixel is asserted at a particular x-y location, then-it will exhibit the color that is assigned to this particular x-y location. When coloring can be based purely on screen or display map coordinates, then for many displays 61, the screen 65 or display map can be prepainted, or have preassigned colors for respective locations (two or one dimensional locations).

Note that the prepainting parameters can be defined for each trace, if desired. In other words, the colors for particular locations may depend upon which waveform plane is being plotted by the processor 43.

A. Architecture

The prepainting method can be implemented in hardware, software, or a combination thereof. In the preferred embodiment, the prepainting method is implemented as software code within the trace coloring system 10 that is executed by the processor 43. The prepainting method uses "k" bits (k=ceiling (log$_2$(# of colors))) of each pixel value to store a color value. The processor associates these k bits with the pixel value when the pixel value is stored in the frame buffer 49 by the processor 43. The remaining bits of each pixel value can be used to plot the waveforms in a variety of manners, including, for example, infinite persistence, grayscale variable persistence, etc.

The decoder 55 (FIG. 1) is configured or programmed so that when the color bits 53 appear without any additional waveform information, then they are ignored. In contrast, when they appear with waveform information, then an appropriate color is generated.

With this method, the trace coloring code 10 within the processor 43 that plots pixels requires only slight change, depending upon the type of memory used in the frame buffer 49 (FIG. 1). When a pixel is plotted in the frame buffer 49, the prepainted color bits should be preserved. This requires a three-cycle read-modify-write operation. Because some display methods require a read-modify-write operation anyway, this requirement may not represent any additional work for the processor 43.

The preferred embodiment utilizes video random access memory (VRAM or video RAM) in the frame buffer 49. The VRAM has a feature that helps with the prepainting method. As part of the write cycle to the VRAM, the user can specify which bits of the destination are allowed to change during a write operation, while the remainder of the bits are masked (prevented from being changed during the access). This feature allows the processor 43 to skip the read-modify part of the cycle, and just write the waveform information into the frame buffer 49 in a single cycle.

B. Operation

For clarity, the prepainting methodology will be described with reference to a nonlimiting specific example.

As an example of the prepainting method, assume the following information: a display screen 65 (FIG. 2) with x-coordinates from 0 to 500, y-coordinates from 0 to 255, a voltage versus time graphical representation, a TTL input signal, the color bands set forth in Table A, set forth previously, a sensitivity of 1 volt/division (typically, 8 divisions vertically), and a channel input offset of 2.5 v. With the aforementioned assumptions, the following voltage to y-coordinate mappings are set forth in Table B as follows:

TABLE B 0.0 v to pixel at y = 48
0.8 v to pixel at y = 74
2.0 v to pixel at y = 112
5.0 v to pixel at y = 208

For each pixel stored in the frame buffer 49, there are 12 bits that are used to draw waveforms: D[11:0]. Two bits can be used to represent 4 colors. Thus, in the preferred embodiment, 2 of the 12 waveform bits are utilized for color, or D[11:10]. Let red=00, blue=01, green=10, and yellow=11. Then, the processor 43 writes to the frame buffer 49 with the following psuedo code:

```
VRAM Mask = 3 << 10;   Set VRAM Write Mask to only write
                       D[11:10]
for x = 0 to 500 do
    for y = 0 to 47 do
        FrameBuffer[x,y] = 0 << 10;   left shift 00 (red) by
                                       10 bits.
    end for;
    for y = 48 to 74 do
        FrameBuffer[x,y] = 1 << 10;   left shift 01 (blue) by
                                       10 bits.
    end for;
    for y = 75 to 111 do
        FrameBuffer[x,y] = 3 << 10;   left shift 11 (yellow)
                                       by 10 bits.
    end for;
    for y = 112 to 208 do
        FrameBuffer[x,y] = 2 << 10;   left shift 10 (green)
                                       by 10 bits.
    end for;
    for y = 209 to 255 do
        FrameBuffer[x,y] = 0 << 10;   left shift 00 (red) by
                                       10 bits.
    end for;
```

The screen 65 is prepainted by programming the frame buffer 49. Assume a simple display mode without tracewise color coding where only 1 bit is used to represent waveform information, and this bit is D[0]. In this event, the trace coloring code 10 programs the frame buffer 49 so that any combination of D[11:0] that has D[0]==0 is ignored, while if D[0]==1, then D[11:10] determines the displayed color.

The pseudo code loop in the trace coloring code 10 for plotting color data can be configured as follows:

```
VRAM Mask = 1;   Set VRAM Write Mask to only write D[0]
for i = 0 to 500
    y = NextSample;
    FrameBuffer[i, y] = 1;   Turn on pixel; Color bits
                             retained by mask
end for;
```

If the data mask is not supported by the frame buffer 49, then read-modify-write operations are substituted, as indicated, for example, hereafter:

FrameBuffer[i, y]=1;
is replaced by:
FrameBuffer[i, y]=1 | FrameBuffer[i, y];
where | is the logical OR operation.

If the prepainting method is not used, then there are several changes to the foregoing example: (1) obviously, the prepainting is not performed, (2) the decoder 55 is configured and/or programmed so that D[11:10] controls the color of the pixel, and D[0] is ignored, and (3) the plotting pseudo code can take the following form, as an example:

```
#define  Red      (0 << 10)
#define  Blue     (1 << 10)
#define  Green    (2 << 10)
#define  Yellow   (3 << 10)
for i = 0 to 500
    y = NextSample;
    if (y <= 47) then
        Color = Red;
    else if (y <= 74) then
        Color = Blue;
    else if (y <= 111) then
        Color = Yellow;
    else if (y <= 208) then
        Color = Green;
    else
        Color = Red;
    FrameBuffer[i, y] = Color;   Plot pixel
end for;
```

III. Spectrum Analyzer

Figure 4:
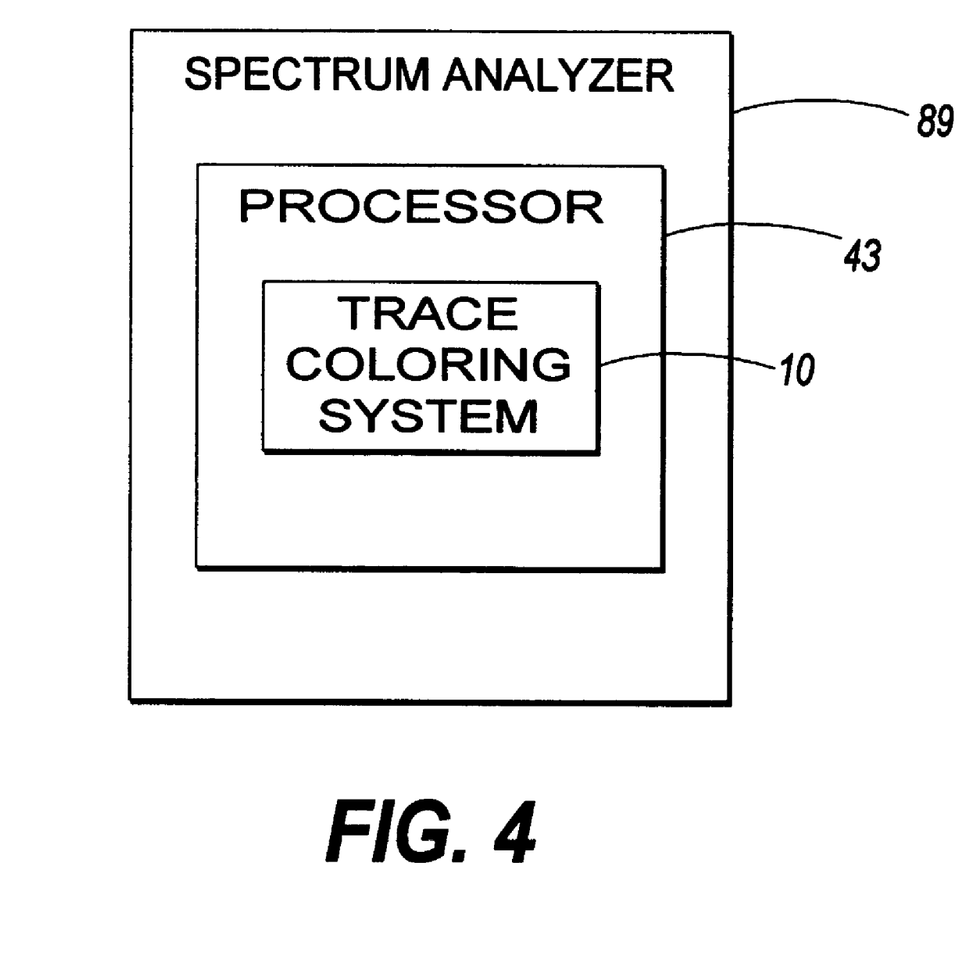
FIG. 4 is an electronic block diagram of a possible implementation of a spectrum analyzer, which is an example of a signal measurement device and which employs the trace coloring system and method of the invention.

FIG. 4 shows another example of a signal measurement device, or a spectrum analyzer 89. In general, as is well known in the art, the spectrum analyzer 89 is a signal measurement device that automatically tunes through a selected frequency spectrum and displays a plot of amplitude versus frequency of the signals present at its input. The spectrum analyzer 89 is, in effect, an automatic Fourier analysis plotter.

In accordance with the invention, the trace coloring system 10 may be employed in the spectrum analyzer 89 for coloring traces. The trace coloring system 10 may be designed to apply different colors to, among other things, different frequency ranges, on the analyzer's display. In architecture, the trace coloring system 10 can be implemented in software, hardware, or a combination thereof. Preferably, the system 10 is implemented in software, stored in a suitable memory, and executed by a processor 43 situated within the spectrum analyzer 89 that is configured to provide pixel data to a frame buffer, which stores the display map.

Optionally, prepainting logic may be employed in connection with the trace coloring system 10. The prepainting logic assigns color values to pixels of the trace based upon locations of the pixels within the display map. When prepainting is employed, the frame buffer is preferably VRAM configured to permit modification of bits of each word, while masking other bits of each the word, so that updating of each the word can be accomplished in a single access operation to the memory.

It will be obvious to those skilled in the art that many modifications and variations may be made to the preferred embodiments of the present invention, as set forth above, without departing substantially from the principles of the present invention. For example, it is possible to implement the high level methodology of the invention in a nondigitizing oscilloscope, such as one having a CRT, as well as in a spectrum analyzer, while still practicing the concepts of the invention, as set forth previously. In the context of a spectrum analyzer, different colors may be allocated to different frequency ranges. All such modifications and variations are intended to be included herein within the scope of the present invention, as defined in the claims that follow.

In the claims set forth hereinafter, the structures, materials, acts, and equivalents of all "means" elements and "logic" elements are intended to include any structures, materials, or acts for performing the functions specified in connection with said elements.

Wherefore, the following is claimed:

1. A system for enhancing information that is provided to users of measurement devices that receive and display electrical signals, comprising:

a signal measurement device having a color display, said signal measurement device configured to receive an electrical signal and to produce a trace following a path defined by values of a first parameter of said signal versus corresponding values of a second parameter; and trace coloring logic associated with said signal measurement device, said trace coloring logic configured to color said trace with a plurality of different colors, each color indicating corresponding ranges of said first parameter values.

2. The system of claim 1, wherein said signal measurement device is an oscilloscope.

3. The system of claim 1, wherein said signal measurement device is a spectrum analyzer.

4. The system of claim 1, wherein said ranges correspond to voltage ranges and wherein said colors comprise a first color indicating a logic low and a second color indicating a logic high.

5. The system of claim 1, wherein said ranges correspond to current ranges and wherein said colors comprise a first color indicating a first current range and a second color indicating a second current range.

6. The system of claim 1, wherein said ranges correspond to time ranges and wherein said colors comprise a first color indicating a first time range and a second color indicating a second time range.

7. The system of claim 1, wherein said ranges correspond to phase ranges and wherein said colors comprise a first color indicating a first phase range and a second color indicating a second phase range.

8. The system of claim 1, wherein said ranges correspond to frequency ranges and wherein said colors comprise a first color indicating a first frequency range and a second color indicating a second frequency range.

9. The system of claim 1, wherein said colors include a particular color that is indicative of a voltage range relative to a reference signal.

10. The system of claim 1, wherein said colors include a particular color that is indicative of a current range relative to a reference signal.

11. The system of claim 1, wherein said colors include a particular color that is indicative of a phase range relative to a reference signal.

12. The system of claim 1, wherein said colors include a particular color that is indicative of a time range relative to a reference signal.

13. The system of claim 1, wherein said colors include a particular color that is indicative of a frequency range relative to a reference signal.

14. The system of claim 1, further comprising:

a processor configured to implement in software said trace coloring logic; and a frame buffer interfaced with said processor, said frame buffer for storing display data including a word for each pixel, said frame buffer comprising video random access memory configured to permit modification of bits of each said word, while masking other bits of each said word, so that updating of each said word can be accomplished in a single access operation to said memory.

15. The system of claim 1, further comprising prepainting logic for assigning color values to pixels of said trace based upon locations of said pixels within a display map.

16. The system of claim 2, wherein said oscilloscope is a digitizing oscilloscope and said display comprises liquid crystal diodes.

17. The system of claim 2, wherein said display comprises a cathode ray tube.

18. The system of claim 4, wherein a third color corresponds to an indeterminate logic level.

19. The system of claim 18, wherein a fourth color corresponds to an undesirable extreme value.

20. A computer readable medium having a computer program, the program comprising trace coloring logic configured to color a trace following a path defined by values of a first parameter of an electrical signal versus corresponding values of a second parameter, said trace generated by a signal measurement device and having a plurality of colors, each color indicating a respective range of said first parameter values.

21. The medium of claim 20, wherein one of said colors indicates a logic low and another of said colors indicates a logic high and wherein said ranges correspond to voltage amplitudes.

22. The medium of claim 20, wherein one of said colors corresponds to a voltage range.

23. The medium of claim 20, wherein one of said colors corresponds to a current range.

24. The medium of claim 20, wherein one of said colors corresponds to a phase range.

25. The medium of claim 20, wherein one of said colors corresponds to a time range.

26. The medium of claim 20, wherein one of said colors corresponds to a frequency range.

27. The medium of claim 20, further comprising prepainting logic configured to assign color values to pixels of said trace based upon locations of said pixels within a display map.

\* \* \* \* \*